US011955267B2

(12) United States Patent
Asahi et al.

(10) Patent No.: US 11,955,267 B2
(45) Date of Patent: Apr. 9, 2024

(54) REACTOR, CORE MEMBER, AND POWER SUPPLY CIRCUIT

(71) Applicant: PANASONIC INTELLECTUAL PROPERTY MANAGEMENT CO., LTD., Osaka (JP)

(72) Inventors: Toshiyuki Asahi, Osaka (JP); Junichi Kotani, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 937 days.

(21) Appl. No.: 16/962,684

(22) PCT Filed: Jan. 15, 2019

(86) PCT No.: PCT/JP2019/000840
§ 371 (c)(1),
(2) Date: Jul. 16, 2020

(87) PCT Pub. No.: WO2019/142755
PCT Pub. Date: Jul. 25, 2019

(65) Prior Publication Data
US 2020/0365311 A1    Nov. 19, 2020

(30) Foreign Application Priority Data

Jan. 17, 2018 (JP) ................. 2018-005966

(51) Int. Cl.
*H01F 27/24* (2006.01)
*H01F 7/06* (2006.01)
(Continued)

(52) U.S. Cl.
CPC .............. *H01F 27/24* (2013.01); *H01F 7/064* (2013.01); *H01F 27/28* (2013.01); *H03H 7/18* (2013.01)

(58) Field of Classification Search
CPC . H01F 27/24; H01F 27/28; H01F 7/06; H01F 7/064; H01F 27/2823; H03H 7/18
(Continued)

(56) References Cited

U.S. PATENT DOCUMENTS

2008/0303624 A1    12/2008 Yamada et al.
2013/0033351 A1    2/2013 Kim et al.
(Continued)

FOREIGN PATENT DOCUMENTS

CN    101354950 A    1/2009
CN    101989485 A    3/2011
(Continued)

OTHER PUBLICATIONS

International Search Report and Written Opinion issued in International Patent Application No. PCT/JP2019/000840, dated Mar. 12, 2019; with partial English translation.
(Continued)

*Primary Examiner* — Danny Nguyen
(74) *Attorney, Agent, or Firm* — Rimon P.C.

(57) ABSTRACT

A reactor includes a first and second winding, a coupling core portion, and a first and second core portion. The coupling core portion forms a coupling magnetic path, through which a magnetic flux generated by the first winding when the first winding is energized and a magnetic flux generated by the second winding when the second winding is energized pass, which magnetically couples the first winding and the second winding together. The first core portion forms a first magnetic path, through which the magnetic flux generated by the first winding when the first winding is energized passes and is aligned with a first plane. The second core portion forms a second magnetic path, through which the magnetic flux generated by the second winding when the second winding is energized passes and is (Continued)

aligned with a second plane. The coupling plane intersects at right angles with the first and second plane.

17 Claims, 6 Drawing Sheets

(51) Int. Cl.
*H01F 27/28* (2006.01)
*H03H 7/18* (2006.01)

(58) Field of Classification Search
USPC .................................................. 361/143, 144
See application file for complete search history.

(56) References Cited

U.S. PATENT DOCUMENTS

| | | | | |
|---|---|---|---|---|
| 2013/0294129 | A1* | 11/2013 | Inaba | H01F 27/255 323/311 |
| 2015/0085532 | A1* | 3/2015 | Tanahashi | H02M 3/33584 336/221 |
| 2015/0085533 | A1* | 3/2015 | Tanahashi | H02M 3/33584 363/17 |
| 2016/0111203 | A1* | 4/2016 | Yamamoto | H01F 37/00 336/212 |

FOREIGN PATENT DOCUMENTS

| | | |
|---|---|---|
| CN | 106783106 A | 5/2017 |
| EP | 2 461 334 A1 | 6/2012 |
| JP | H11-144971 A | 5/1999 |
| JP | 2001-093737 A | 4/2001 |
| JP | 2007-311397 A | 11/2007 |
| JP | 2008-288441 A | 11/2008 |
| JP | 2009-105465 A | 5/2009 |
| JP | 2012-065453 A | 3/2012 |
| JP | 2018-029124 A | 2/2018 |
| KR | 10-2010-0078500 A | 7/2010 |
| WO | 2018/173900 A1 | 9/2018 |

OTHER PUBLICATIONS

First Office Action dated Sep. 22, 2021, issued in corresponding Chinese Patent Application No. 201980008748.7; with English translation.

* cited by examiner

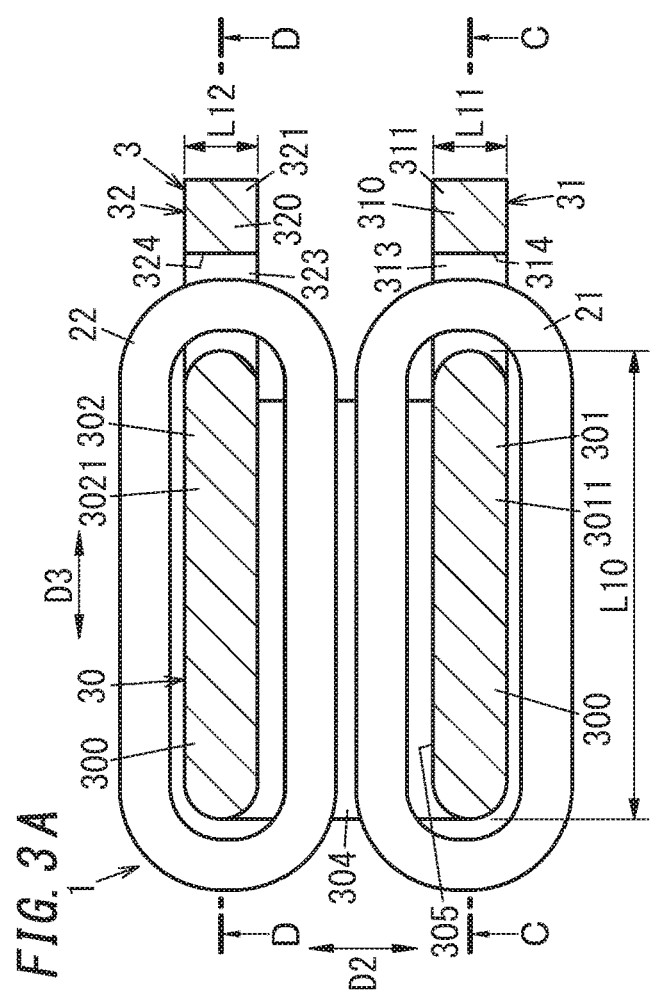
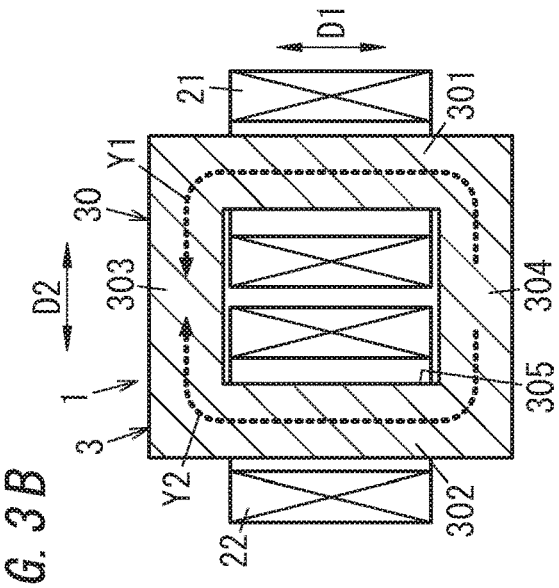
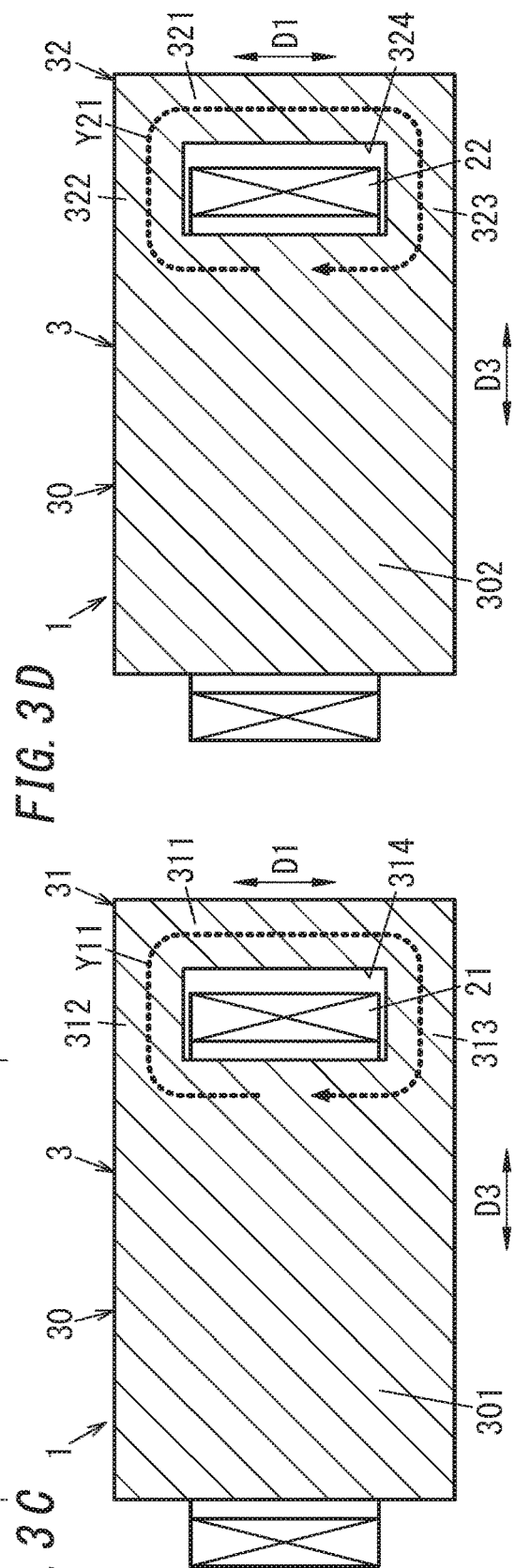
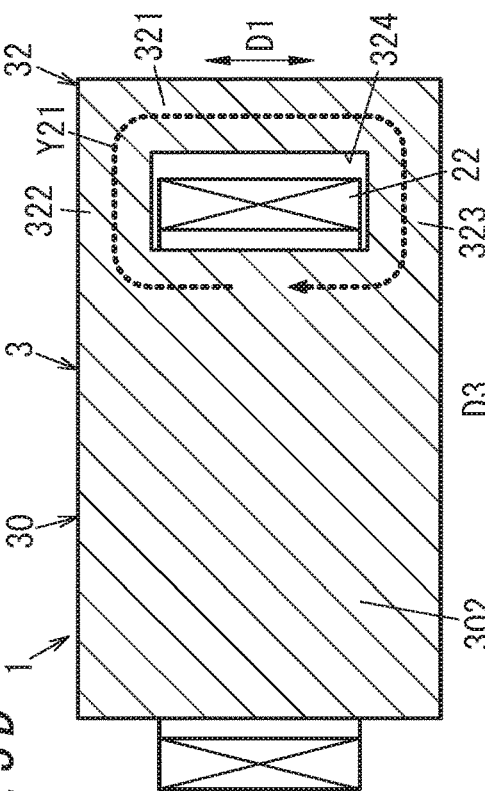
FIG. 3A
FIG. 3B
FIG. 3C
FIG. 3D

REACTOR, CORE MEMBER, AND POWER SUPPLY CIRCUIT

CROSS-REFERENCE OF RELATED APPLICATIONS

This application is the U.S. National Phase under 35 U.S.C. § 371 of International Patent Application No. PCT/JP2019/000840, filed on Jan. 15, 2019, which in turn claims the benefit of Japanese Application No. 2018-005966, filed on Jan. 17, 2018, the entire disclosures of which Applications are incorporated by reference herein.

TECHNICAL FIELD

The present disclosure generally relates to a reactor, a core member, and a power supply circuit, and more particularly relates to a magnetically couple reactor, a core member, and a power supply circuit.

BACKGROUND ART

A known reactor for multi-phase converters is disclosed in, for example, Patent Literature 1. The reactor of Patent Literature 1 includes a core and multi-phase converter coils wound around the core and magnetically coupled together.

The core is a combination of a plurality of core materials. The plurality of core materials includes an inside-of-coil core material and an outside-of-coil core material. The inside-of-coil core material forms at least part of a portion of the core around which a converter coil is wound. The outside-of-coil core material forms a portion of the core around which no converter coils are wound.

In the field of reactors, there has been an increasing demand for reactors of an even smaller size.

CITATION LIST

Patent Literature

Patent Literature 1: JP 2012-65453 A

SUMMARY OF INVENTION

In view of the foregoing background, it is therefore an object of the present disclosure to provide a reactor, a core member, and a power supply circuit, all of which contribute to further reducing the size of reactors.

A reactor according to an aspect of the present disclosure includes a first winding, a second winding, a coupling core portion, a first core portion, and a second core portion. The coupling core portion forms a coupling magnetic path, through which a magnetic flux generated by the first winding when the first winding is energized and a magnetic flux generated by the second winding when the second winding is energized pass, which magnetically couples the first winding and the second winding together, and which is aligned with a coupling plane that is a predetermined plane. The first core portion forms a first magnetic path, through which the magnetic flux generated by the first winding when the first winding is energized passes and which is aligned with a first plane. The second core portion forms a second magnetic path, through which the magnetic flux generated by the second winding when the second winding is energized passes and which is aligned with a second plane. The coupling plane intersects at right angles with the first plane and the second plane.

A core member according to another aspect of the present disclosure includes the coupling core portion, the first core portion, and the second core portion of the reactor described above.

A power supply circuit according to still another aspect of the present disclosure includes: the reactor described above; and a control unit to control an electric current flowing through the first winding and the second winding.

BRIEF DESCRIPTION OF DRAWINGS

FIG. 3A is a cross-sectional view of the reactor taken along the plane A-A;

FIG. 3B is a cross-sectional view of the reactor taken along the plane B-B;

FIG. 3C is a cross-sectional view of the reactor taken along the plane C-C;

FIG. 3D is a cross-sectional view of the reactor taken along the plane D-D;

DESCRIPTION OF EMBODIMENTS

Note that embodiments and their variations to be described below are only examples of the present disclosure and should not be construed as limiting. Rather, those embodiments and variations may be readily modified in various manners depending on a design choice or any other factor without departing from a true spirit and scope of the present disclosure.

EMBODIMENTS

(1) Overview

Figure 1:
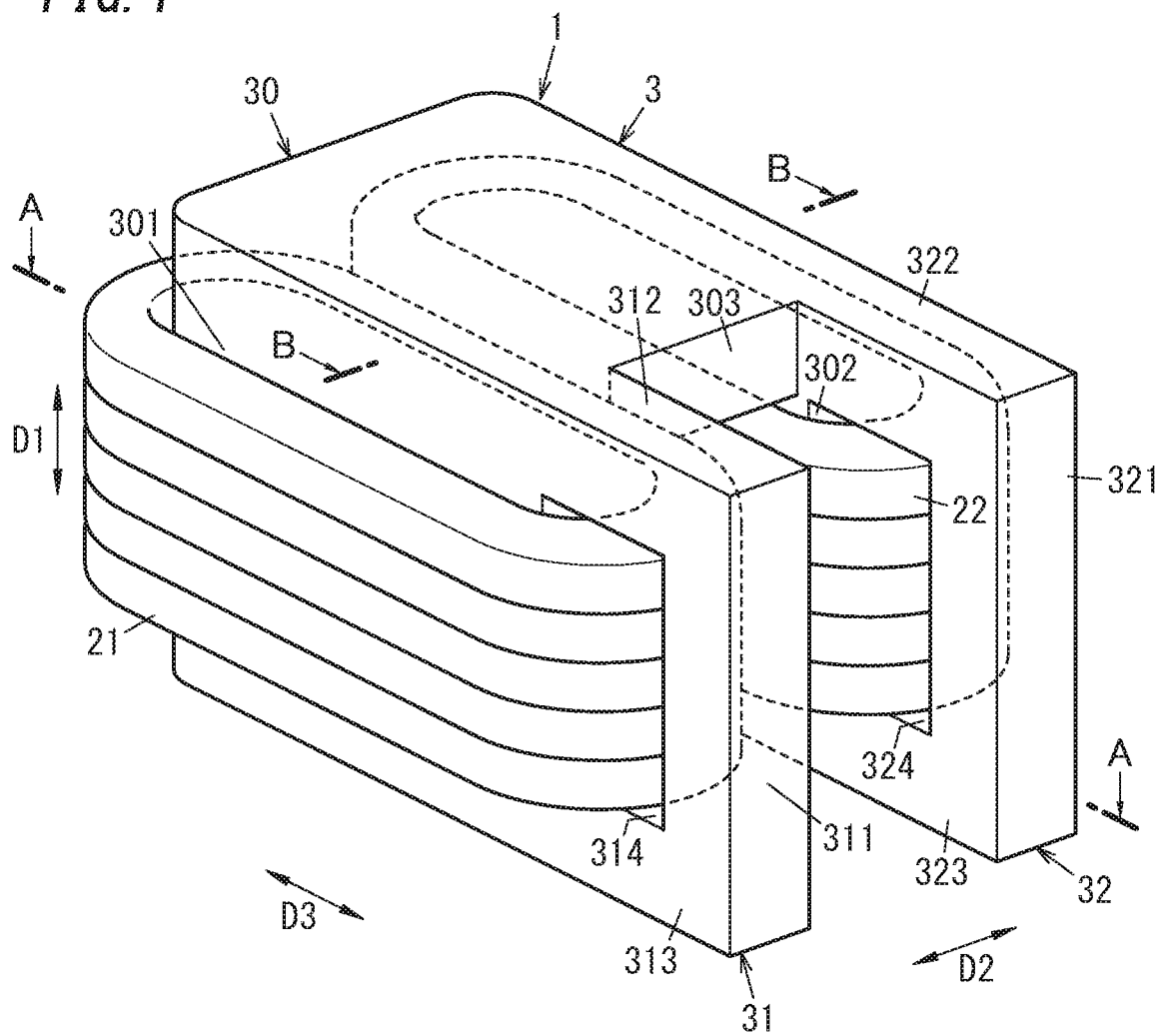
FIG. 1 is a perspective view illustrating the appearance of a reactor according to an exemplary embodiment of the present disclosure.

A perspective view illustrating the appearance of a reactor according to an exemplary embodiment is shown in FIG. 1. The reactor 1 according to this embodiment is implemented as a two-phase magnetically coupled reactor. The reactor 1 has a magnetic coupling capability of magnetically coupling a first winding 21 and a second winding 22 together, and an inductor capability of storing or releasing the respective magnetic energies of the first winding 21 and the second winding 22.

The reactor 1 includes the first winding 21, the second winding 22, and a core member 3. The first winding 21 and the second winding 22 are wound around the core member 3. The core member 3 includes a coupling core portion 30, a first core portion 31, and a second core portion 32. The coupling core portion 30 magnetically couples the first winding 21 and the second winding 22 together. The first core portion 31 stores or releases the magnetic energy generated by an electric current flowing through the first winding 21. The second core portion 32 stores or releases the magnetic energy generated by an electric current flowing through the second winding 22.

Figure 2:
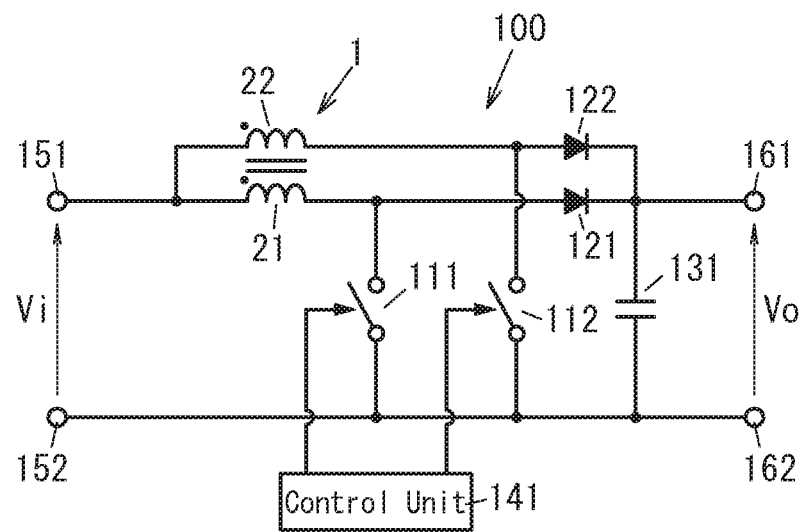
FIG. 2 is a circuit diagram of a power supply circuit including the reactor.

The reactor 1 according to this embodiment may be used in a power supply circuit 100 (see FIG. 2) provided for a power conditioner, an electronic device, and various other types of devices for automobiles, dwelling houses, and non-dwelling houses. In other words, the power supply circuit 100 according to this embodiment includes the reactor 1. A circuit diagram of the power supply circuit 100 according to this embodiment is shown in FIG. 2.

The power supply circuit 100 according to this embodiment is implemented as a multi-phase (interleaved) booster chopper circuit configured to boost an input voltage Vi and output the boosted voltage. The power supply circuit 100 includes the reactor 1, two switching elements (namely, a first switching element 111 and a second switching element 112), two diodes (namely, a first diode 121 and a second diode 122), a capacitor 131, and a control unit 141.

In the power supply circuit 100 according to this embodiment, a DC input voltage Vi is applied between a pair of input terminals 151, 152. Between the pair of input terminals 151, 152, a series circuit of the first winding 21 of the reactor 1 and the first switching element 111 and a series circuit of the second winding 22 of the reactor 1 and the second switching element 112 are electrically connected together in parallel.

The first winding 21 and the second winding 22 are magnetically coupled together via the coupling core portion 30 of the core member 3. One terminal of the first winding 21 and one terminal of the second winding 22 are electrically connected to the high-potential input terminal 151.

The first switching element 111 and the second switching element 112 may be implemented as metal-oxide semiconductor field-effect transistors (MOSFETs), for example.

The first switching element 111 has one terminal thereof electrically connected to the high-potential input terminal 151 via the first winding 21 and the other terminal thereof electrically connected to the low-potential input terminal 152. The second switching element 112 has one terminal thereof electrically connected to the high-potential input terminal 151 via the second winding 22 and the other terminal thereof electrically connected to the low-potential input terminal 152. The first switching element 111 and the second switching element 112 have their ON/OFF states controlled by the control unit 141.

Between the two terminals of the first switching element 111, a series circuit of the first diode 121 and the capacitor 131 is electrically connected. Between the two terminals of the second switching element 112, a series circuit of the second diode 122 and the capacitor 131 is electrically connected. In other words, between the two terminals of the capacitor 131, the series circuit of the first switching element 111 and the first diode 121 and the series circuit of the second switching element 112 and the second diode 122 are electrically connected together in parallel.

The capacitor 131 is implemented as a smoothing capacitor and is electrically connected between a pair of output terminals 161, 162. The first diode 121 has its anode electrically connected to the node of connection between the first winding 21 and the first switching element 111 and has its cathode electrically connected to the capacitor 131. The second diode 122 has its anode electrically connected to the node of connection between the second winding 22 and the second switching element 112 and has its cathode electrically connected to the capacitor 131.

The control unit 141 outputs a control signal for controlling the first switching element 111 and the second switching element 112. The control signal is applied either directly or via a driver circuit to the respective gates of the first switching element 111 and the second switching element 112, thereby turning ON and OFF the first switching element 111 and the second switching element 112 on an individual basis. The control unit 141 controls the ON/OFF states of the first switching element 111 and the second switching element 112 by pulse width modulation (PWM) method that makes the duty cycle adjustable. The control unit 141 may be implemented as, for example, a computer system including a central processing unit (CPU).

The control unit 141 controls the electric current flowing through the first winding 21 and the second winding 22 by controlling the ON/OFF states of the first switching element 111 and the second switching element 112.

When the first switching element 111 turns ON, an electric current flows through the first winding 21 to generate a magnetic flux. Part of the magnetic flux generated when the first winding 21 is energized passes through a first magnetic path formed by the first core portion 31 of the core member 3. The first core portion 31 stores, as magnetic energy, the magnetic flux generated by the first winding 21. When the first switching element 111 turns OFF, the magnetic energy stored in the first core portion 31 is released, thus causing an electric current to flow through the capacitor 131 and thereby charging the capacitor 131.

When the second switching element 112 turns ON, an electric current flows through the second winding 22 to generate a magnetic flux. Part of the magnetic flux generated when the second winding 22 is energized passes through a second magnetic path formed by the second core portion 32 of the core member 3. The second core portion 32 stores, as magnetic energy, the magnetic flux generated by the second winding 22. When the second switching element 112 turns OFF, the magnetic energy stored in the second core portion 32 is released, thus causing an electric current to flow through the capacitor 131 and thereby charging the capacitor 131.

Turning the first switching element 111 and the second switching element 112 ON and OFF in this manner causes the input voltage Vi to be boosted, and thereby an output voltage Vo to be generated, between the two terminals of the capacitor 131.

The control unit 141 controls the first switching element 111 and the second switching element 112 so as to turn the first switching element 111 and the second switching element 112 ON alternately. That is to say, the control unit 141 controls the first switching element 111 and the second switching element 112 such that the phase of a ripple current flowing through the first winding 21 and the phase of a ripple current flowing through the second winding 22 are shifted from each other by 180 degrees.

In addition, part of the magnetic flux generated when the first winding 21 is energized and part of the magnetic flux generated when the second winding 22 is energized pass through a coupling magnetic path formed by the coupling core portion 30 of the core member 3. The first winding 21 and the second winding 22 are wound in the same direction around the core member 3 and are configured such that DC magnetic fluxes (i.e., DC components of the magnetic fluxes) generated on the coupling magnetic path by the first winding 21 and the second winding 22 when these windings are energized have mutually opposite directions and cancel each other. That is to say, in the power supply circuit 100 according to this embodiment, the reactor 1 operates as a magnetism canceling reactor. Note that the first winding 21 and the second winding 22 just need to be configured such that the DC magnetic fluxes generated by the first winding 21 and the second winding 22 when these windings are energized cancel each other. Thus, the first winding 21 and the second winding 22 may be wound in opposite directions as well. Also, in the circuit signs of the first winding 21 and second winding 22 shown in FIG. 2, the dots indicating the beginning of winding may be located at opposite positions.

In the power supply circuit 100 according to this embodiment, the capacitor 131 repeatedly performs charging and discharging operations at a cycle time which is twice as long as one switching cycle time of the first switching element 111 and the second switching element 112. This contributes to downsizing the capacitor 131. In addition, circuit components with relatively low breakdown voltages and breakdown currents (including the capacitor 131, the first switching element 111, and the second switching element 112) may be adopted in the power supply circuit 100.

(2) Configuration for Reactor

Next, a detailed configuration for the reactor 1 according to this embodiment will be described with reference to FIG. 1 and FIGS. 3A-3D. Note that in FIG. 1 and FIGS. 3A-3D, the first winding 21 and the second winding 22 are illustrated just schematically, and their numbers of turns may be different from actual ones. In addition, in FIG. 1 and FIGS. 3A-3D, neither both terminals of the first winding 21 nor those of the second winding 22 are illustrated.

The reactor 1 according to this embodiment includes the first winding 21, the second winding 22, and the core member 3. In the following description, the direction aligned with the axis of the first winding 21 and the axis of the second winding 22 is defined herein to be a "first direction D." The direction perpendicular to the first direction D1 and aligned with the direction in which the first winding 21 and the second winding 22 are arranged side by side is defined herein to be a "second direction D2." The direction perpendicular to both of the first direction D1 and the second direction D2 is defined herein to be a "third direction D3." Note that the arrows indicating the first, second, and third directions D1, D2, D3 on the drawings are shown there just for the sake of description and are actually insubstantial ones.

The core member 3 includes the coupling core portion 30, the first core portion 31, and the second core portion 32. In this embodiment, the coupling core portion 30, the first core portion 31, and the second core portion 32 are formed integrally with each other. As used herein, if a plurality of members are integrated together, then those members are not always formed by integral forming process but may also be bonded together with an adhesive or any other bonding material as well. The core member 3 may be configured as a dust core made of an alloy such as an iron-silicon-aluminum (Fe—Si—Al) alloy, an iron-nickel (Fe—Ni) alloy, or an iron-silicon (Fe—Si) alloy.

The coupling core portion 30 is formed in the shape of a square tube with both ends in the third direction D3 open. The coupling core portion 30 includes a first axial portion 301, a second axial portion 302, a first connecting portion 303, a second connecting portion 304, and a through hole 305.

The first axial portion 301 is formed to be aligned with the first direction D1 and the first winding 21 is wound around the first axial portion 301. The second axial portion 302 is formed to be aligned with the first direction D1 and the second winding 22 is wound around the second axial portion 302. The first axial portion 301 and the second axial portion 302 are arranged side by side, and face each other, in the second direction D2. As shown in FIG. 3A, respective cross sections 3011, 3021 of the first axial portion 301 and the second axial portion 302 taken along a plane aligned with the second direction D2 and the third direction D3 have a shape, of which the longitudinal axis is aligned with the third direction D3. Specifically, the respective cross sections 3011, 3021 of the first axial portion 301 and the second axial portion 302 are formed in the shape of an ellipse, both ends in the third direction D3 of which have an arc shape.

The first connecting portion 303 is formed to be aligned with the second direction D2. The first connecting portion 303 is formed to connect together one end in the first direction D1 of the first axial portion 301 and one end in the first direction D1 of the second axial portion 302 (e.g., the respective upper ends thereof in the example illustrated in FIG. 3B). The second connecting portion 304 is formed to be aligned with the second direction D2. The second connecting portion 304 is formed to connect together the other end in the first direction D1 of the first axial portion 301 and the other end in the first direction D1 of the second axial portion 302 (e.g., the respective lower ends thereof in the example illustrated in FIG. 3B). The first connecting portion 303 and the second connecting portion 304 are arranged one on top of the other, and face each other, in the first direction D1. The respective cross sections of the first connecting portion 303 and the second connecting portion 304 taken along a plane aligned with the first direction D1 and the third direction D3 have a rectangular shape, of which the longitudinal axis is aligned with the third direction D3.

The through hole 305 is provided to run in the third direction D3. The through hole 305 is surrounded with the first axial portion 301, the second axial portion 302, the first connecting portion 303, and the second connecting portion 304, and has a rectangular opening. Part of the first winding 21 wound around the first axial portion 301 and part of the second winding 22 wound around the second axial portion 302 pass through the through hole 305.

The first winding 21 and the second winding 22 are wound around the coupling core portion 30. The coupling core portion 30 forms, as a closed magnetic path through which the magnetic fluxes generated by the first winding 21 and the second winding 22 when these windings are energized pass, a coupling magnetic path aligned with a coupling plane that is a plane aligned with the first direction D1 and the second direction D2 (see FIG. 3B). Specifically, the coupling magnetic path is formed by the first axial portion 301, the second axial portion 302, the first connecting portion 303, and the second connecting portion 304. The first winding 21 and the second winding 22 are magnetically coupled together through the coupling magnetic path formed by the coupling core portion 30. In other words, the coupling core portion 30 magnetically couples the first winding 21 and the second winding 22 together.

The first core portion 31 is provided on one side (e.g., on the right in FIG. 3C) in the third direction D3 with respect to the coupling core portion 30. The first core portion 31 is formed in a C-shape and connected to the coupling core portion 30 so as to surround part of the first winding 21 along with the coupling core portion 30. The first core portion 31 forms, as a closed magnetic path which is provided for the first winding 21 and through which a magnetic flux generated when the first winding 21 is energized passes, a first magnetic path aligned with a first plane that is a plane aligned with the first direction D1 and the third direction D3 (see FIG. 3C) Specifically, the first magnetic path is formed by the first core portion 31 and the first axial portion 301 of the coupling core portion 30. That is to say, in this embodiment, the first axial portion 301 serves as both the coupling magnetic path and the first magnetic path.

The first core portion 31 includes three core pieces 311-313.

The core piece 311 is formed in the shape of a prism aligned with the first direction D1. The core piece 311 is provided on one side (e.g., on the right in FIG. 3C) in the third direction D3 with respect to the first axial portion 301 so as to be arranged side by side with the first axial portion 301 and to face the first axial portion 301 in the third direction D3.

The core piece 312 is formed in the shape of a prism aligned with the third direction D3. The core piece 312 is formed to connect together one end in the first direction D1 of the core piece 311 and one end in the first direction D1 of the first axial portion 301 (e.g., the upper ends thereof in FIG. 3C). The core piece 313 is formed in the shape of a prism aligned with the third direction D3. The core piece 313 is formed to connect together the other end in the first direction D1 of the core piece 311 and the other end in the first direction D1 of the first axial portion 301 (e.g., the lower ends thereof in FIG. 3C). The core piece 312 and the core piece 313 face each other in the first direction D1.

The core member 3 has a through hole 314 surrounded with the first core portion 31 and the first axial portion 301. The through hole 314 is provided to run in the second direction D2 and has a rectangular opening. Part of the first winding 21 wound around the first axial portion 301 passes through the through hole 314.

The coupling magnetic path is formed to be aligned with the coupling plane as a primary plane. The first magnetic path is formed to be aligned with the first plane as another primary plane. The coupling plane is a plane aligned with the first direction D1 and the second direction D2 of the coupling core portion 30 (see FIG. 3B). The first plane is a plane aligned with the first direction D1 and the third direction D3 of the first core portion 31 and the first axial portion 301 (see FIG. 3C). Thus, the coupling plane and the first plane intersect with each other at right angles. In other words, a normal to the coupling plane (corresponding to the third direction D3) and a normal to the first plane (corresponding to the second direction D2) intersect with each other at right angles.

The second core portion 32 is provided on one side (e.g., on the right in FIG. 3D) in the third direction D3 with respect to the coupling core portion 30. The second core portion 32 is formed in a C-shape and connected to the coupling core portion 30 so as to surround a part of the second winding 22 along with the coupling core portion 30. The second core portion 32 forms, as a closed magnetic path which is provided for the second winding 22 and through which a magnetic flux generated when the second winding 22 is energized passes, a second magnetic path aligned with a second plane that is a plane aligned with the first direction D1 and the third direction D3 (see FIG. 3D) Specifically, the second magnetic path is formed by the second core portion 32 and the second axial portion 302 of the coupling core portion 30. That is to say, in this embodiment, the second axial portion 302 serves as both the coupling magnetic path and the second magnetic path.

The second core portion 32 includes three core pieces 321-323. The second core portion 32 faces the first core portion 31 in the second direction D2 and is spaced apart from the first core portion 31 in the second direction D2.

The core piece 321 is formed in the shape of a prism aligned with the first direction D1. The core piece 321 is provided on one side (e.g., on the right in FIG. 3D) in the third direction D3 with respect to the second axial portion 302 so as to be arranged side by side with the second axial portion 302 and to face the second axial portion 302 in the third direction D3. In addition, the core piece 321 faces the core piece 311 of the first core portion 31 in the second direction D2. The core piece 322 is formed in the shape of a prism aligned with the third direction D3.

The core piece 322 is formed to connect together one end in the first direction D1 of the core piece 321 and one end in the first direction D1 of the second axial portion 302 (e.g., the upper ends thereof in FIG. 3D). The core piece 323 is formed in the shape of a prism aligned with the third direction D3. The core piece 323 is formed to connect together the other end in the first direction D1 of the core piece 321 and the other end in the first direction D1 of the second axial portion 302 (e.g., the lower ends thereof in FIG. 3D). The core piece 322 and the core piece 323 face each other in the first direction D1. Also, the core pieces 322 and 323 face the core pieces 312 and 313, respectively, in the second direction D2.

The core member 3 has a through hole 324 surrounded with the second core portion 32 and the second axial portion 302. The through hole 324 is provided to run in the second direction D2 and has a rectangular opening. Part of the second winding 22 wound around the second axial portion 302 passes through the through hole 324.

The coupling magnetic path is formed to be aligned with the coupling plane as a primary plane. The first magnetic path is formed to be aligned with the second plane as another primary plane. The coupling plane is a plane aligned with the first direction D1 and the second direction D2 of the coupling core portion 30 (see FIG. 3B). The second plane is a plane aligned with the first direction D1 and the third direction D3 of the second core portion 32 and the second axial portion 302 (see FIG. 3D). Thus, the coupling plane and the second plane intersect with each other at right angles. In other words, a normal to the coupling plane (corresponding to the third direction D3) and a normal to the second plane (corresponding to the second direction D2) intersect with each other at right angles.

Also, the first plane (see FIG. 3C) and the second plane (see FIG. 3D) are parallel to each other. In other words, a normal to the first plane (corresponding to the second direction D2) and a normal to the second plane (corresponding to the second direction D2) are parallel to each other.

The first winding 21 is an electrically conductive wire (coil), which has a rectangular cross section and which is formed to be wound around the first axial portion 301 as its axis. The second winding 22 is an electrically conductive wire (coil), which has a rectangular cross section and which is formed to be wound around the second axial portion 302 as its axis. When viewed along their axis (i.e., when viewed in the first direction D1), the first winding 21 and the second winding 22 are each wound in the shape of an ellipse, of which the major axis is defined in the third direction D3. The number of turns of the first winding 21 is equal to the number of turns of the second winding 22. Optionally, the number of turns of the first winding 21 and the number of turns of the second winding 22 may be changed as appropriate depending on a design choice or any other factor. The number of turns of the first winding 21 and the number of turns of the second winding 22 may be mutually different numbers. In addition, the first winding 21 and the second winding 22 do not have to be electrically conductive wires with a rectangular cross section but may also be electrically conductive wires with a circular cross section.

As described above, the first winding 21 and the second winding 22 are wound around the coupling core portion 30. Therefore, the respective magnetic fluxes generated by the first winding 21 and the second winding 22 both pass through the coupling magnetic path formed by the coupling core portion 30 (namely, the first axial portion 301, the second axial portion 302, the first connecting portion 303, and the second connecting portion 304). This allows the first winding 21 and the second winding 22 to be magnetically coupled together. That is to say, the magnetic coupling capability of magnetically coupling the first winding 21 and the second winding 22 together is implemented by the coupling core portion 30.

In this case, the direction of the DC magnetic fluxes generated by the first winding 21 and the second winding 22 is determined by the winding directions of the first winding 21 and the second winding 22 and the direction in which a DC current flows through the first winding 21 and the second winding 22. As used herein, the "DC magnetic fluxes" refer to magnetic fluxes generated by a DC current flowing through the first winding 21 and the second winding 22. The first winding 21 and the second winding 22 have the same winding direction and have one end thereof electrically connected to the high-potential input terminal 151 of the power supply circuit 100 (see FIG. 2). Therefore, in the coupling magnetic path, the direction of the DC magnetic flux generated by the first winding 21 when the first winding 21 is energized and the direction of the DC magnetic flux generated by the second winding 22 when the second winding 22 ha energized become opposite from each other. Consequently, on the coupling magnetic path formed by the coupling core portion 30, the DC magnetic flux generated by the first winding 21 and the DC magnetic flux generated by the second winding 22 come to have two opposite directions, and therefore, cancel each other. In FIG. 3B, the direction of the DC magnetic flux generated by the first winding 21 on the coupling magnetic path is indicated schematically by the dotted arrow Y1, and the direction of the DC magnetic flux generated by the second winding 22 on the coupling magnetic path is indicated schematically by the dotted arrow Y2. Note that the directions, indicated by the dotted arrows Y1, Y2 in FIG. 3B, of the DC magnetic fluxes generated by the first winding 21 and the second winding 22 are only examples, and may be both reversed.

Also, in this embodiment, the first axial portion 301 around which the first winding 21 is wound serves as both the coupling magnetic path and the first magnetic path. Thus, the magnetic flux generated by the first winding 21 splits into a magnetic flux passing through the coupling magnetic path formed by the coupling core portion 30 and a magnetic flux passing through the first magnetic path formed by the first core portion 31. In FIG. 3C, the direction of the DC magnetic flux generated by the first winding 21 on the first magnetic path is indicated schematically by the dotted arrow Y11. The first core portion 31 stores, as magnetic energy, the magnetic flux generated by the first winding 21 which passes through the first magnetic path. That is to say, the inductor capability of storing and releasing the magnetic energy generated by the first winding 21 is implemented by the first core portion 31. Also, as for the magnetic flux passing through the first magnetic path, the magnetic flux generated by the first winding 21 is dominating, and the magnetic flux generated by the second winding 22 may be regarded as zero. Therefore, it can be said that the first magnetic path is a non-coupling magnetic path that does not magnetically couple the first winding 21 and the second winding 22 together. As used herein, the term "non-coupling" refers to not only a situation where the coupling coefficient of the first winding 21 and second winding 22 on the first magnetic path is exactly equal to zero but also a situation where their coupling coefficient falls within a tolerance range in which the coupling coefficient may be regarded as substantially equal to zero.

Furthermore, in this embodiment, the second axial portion 302 around which the second winding 22 is wound serves as both the coupling magnetic path and the second magnetic path. Thus, the magnetic flux generated by the second winding 22 splits into a magnetic flux passing through the coupling magnetic path formed by the coupling core portion 30 and a magnetic flux passing through the second magnetic path formed by the second core portion 32. In FIG. 3D, the direction of the DC magnetic flux generated by the second winding 22 on the second magnetic path is indicated schematically by the dotted arrow Y21. The second core portion 32 stores, as magnetic energy, the magnetic flux generated by the second winding 22 which passes through the second magnetic path. That is to say, the inductor capability of storing and releasing the magnetic energy generated by the second winding 22 is implemented by the second core portion 32. Also, as for the magnetic flux passing through the second magnetic path, the magnetic flux generated by the second winding 22 is dominating, and the magnetic flux generated by the first winding 21 may be regarded as zero. Therefore, it can be said that the second magnetic path is a non-coupling magnetic path that does not magnetically couple the first winding 21 and the second winding 22 together. As used herein, the term "non-coupling" refers to not only a situation where the coupling coefficient of the first winding 21 and second winding 22 on the second magnetic path is exactly equal to zero but also a situation where their coupling coefficient falls within a tolerance range in which the coupling coefficient may be regarded as substantially equal to zero.

In this embodiment, the ratio of the magnetic flux generated by the first winding 21 which passes through the coupling magnetic path to the overall magnetic flux generated by the first winding 21 represents the coupling coefficient of the magnetic coupling between the first winding 21 and the second winding 22. Likewise, the ratio of the magnetic flux generated by the second winding 22 which passes through the coupling magnetic path to the overall magnetic flux generated by the second winding 22 represents the coupling coefficient of the magnetic coupling between the first winding 21 and the second winding 22.

As the coupling coefficient increases, the magnetic fluxes passing through the first magnetic path and the second magnetic path decrease. Thus, to boost the input voltage Vi to a predetermined voltage value in the power supply circuit 100 (see FIG. 2), the inductance needs to be increased by increasing the number of turns of the first winding 21 and second winding 22, for example. In addition, the volume of the core member 3 needs to be increased to prevent the core member 3 (including the coupling core portion 30, the first core portion 31, and the second core portion 32) from being saturated magnetically. Consequently, the overall size of the reactor 1 could increase significantly.

Also, in the power supply circuit 100 (see FIG. 2), if the first switching element 111 and the second switching element 112 have a duty cycle of 75%, for example, the effective value of the ripple current becomes the lowest when the coupling coefficient is about 0.5.

In the reactor 1 according to this embodiment, to strike a balance between the inductance and the flux density and thereby reduce the effective value of the ripple current, the coupling coefficient is set at a value falling within the range from about 0.3 to about 0.7. Examples of parameters that determine the coupling coefficient include the lengths of the magnetic paths (including the coupling magnetic path, the first magnetic path, and the second magnetic path), the cross-sectional areas of the magnetic paths (including the coupling magnetic path, the first magnetic path, and the second magnetic path), and the material for the core member 3.

The coupling magnetic path passes inside both of the first winding 21 and second winding 22, and therefore, has a greater magnetic path length than the first magnetic path and the second magnetic path, each of which passes through only one winding (which is either the first winding 21 or the second winding 22). This constitutes a factor of causing a decrease in coupling coefficient. Thus, in this embodiment, a cross section of the coupling magnetic path (hereinafter referred to as a "coupling cross section 300") of the coupling core portion 30 is configured to have a larger area than a cross section of the first magnetic path (hereinafter referred to as a "first cross section 310") of the first core portion 31 and a cross section of the second magnetic path (hereinafter referred to as a "second cross section 320") of the second core portion 32. Specifically, as shown in FIG. 3A, the dimension L10 measured along a normal to the coupling plane (i.e., measured in the third direction D3) of the coupling core portion 30 is larger than the dimension L11 measured along a normal to the first plane (i.e., measured in the second direction D2) of the first core portion 31 (see FIG. 3C) and the dimension L2 measured along a normal to the second plane (i.e., measured in the second direction D2) of the second core portion 32 (see FIG. 3D). That is to say, this configuration is designed to reduce the magnetic resistance of the coupling magnetic path by extending the width (i.e., the dimension L10) of the coupling magnetic path. This reduces the chances of the coupling coefficient becoming too low.

As used herein, the coupling cross section 300 refers to a cross section intersecting at right angles with the coupling magnetic path of the coupling core portion 30. More specifically, the coupling cross section 300 refers to a cross section intersecting at right angles with the coupling magnetic path of the coupling core portion 30 which has the smallest area and the highest magnetic flux density. In this embodiment, the coupling cross section 300 is supposed to be cross sections 3011, 3021 of the first axial portion 301 and the second axial portion 302 taken along a plane aligned with the second direction D2 and the third direction D3 by way of example (see FIG. 3A). The dimension L10 measured along a normal to the coupling plane (i.e., measured in the third direction D3) of the coupling core portion 30 corresponds to a dimension measured in the third direction D3 of the coupling cross section 300. Note that the coupling cross section 300 does not have to be the cross sections 3011, 3021 of the first axial portion 301 and the second axial portion 302 but may also be a cross section of the first connecting portion 303 or the second connecting portion 304 taken along a plane aligned with the first direction D1 and the third direction D3.

Likewise, the first cross section 310 is across section, intersecting at right angles of the first magnetic path, of the first core portion 31 and refers to a portion having the smallest area and the highest magnetic flux density. The second cross section 320 is a cross section, intersecting at right angles of the second magnetic path, of the second core portion 32 and refers to a portion having the smallest area and the highest magnetic flux density. In this embodiment, the first cross section 310 is supposed to be a cross section of the core piece 311 of the first core portion 31 taken along a plane aligned with the second direction D2 and the third direction D3 (see FIG. 3A). The second cross section 320 is supposed to be a cross section of the core piece 321 of the second core portion 32 taken along a plane aligned with the second direction D2 and the third direction D3 (see FIG. 3A). The dimension L11 measured along a normal to the first plane (see FIG. 3C) (i.e., measured in the second direction D2) of the first core portion 31 corresponds to the dimension measured in the second direction D2 of the first cross section 310. The dimension L12 measured along a normal to the second plane (see FIG. 3D) (i.e., measured in the second direction D2) of the second core portion 32 corresponds to the dimension measured in the second direction D2 of the second cross section 320. In this embodiment, the dimension L11 and the dimension L12 are equal to each other. Note that the first cross section 310 does not have to be a cross section of the core piece 311 but may also be a cross section of the core piece 312 or the core piece 313 taken along a plane aligned with the first direction D1 and the second direction D2. Likewise, the second cross section 320 does not have to be a cross section of the core piece 321 but may also be a cross section of the core piece 322 or the core piece 323 taken along a plane aligned with the first direction D1 and the second direction D2.

In this embodiment, the first cross section 310 and the second cross section 320 are generally square but the coupling cross section 300 is elongate in the third direction D3 as shown in FIG. 3A. In addition, the coupling cross section 300, the first cross section 310, and the second cross section 320 have an approximately equal dimension in the second direction D2. Therefore, the coupling coefficient may be controlled by adjusting the dimension L0 measured in the third direction D3 of the coupling cross section 300 (including the first axial portion 301 and the second axial portion 302) during the design process of the reactor 1. This allows the reactor 1 according to this embodiment to control the coupling coefficient more easily to set the coupling coefficient at a value falling within the range from 0.3 to 0.7.

Furthermore, in this embodiment, the core member 3 is configured such that the coupling plane formed by the coupling magnetic path intersects at right angles with the first plane formed by the first magnetic path and the second plane formed by the second magnetic path. This allows the reactor 1 according to this embodiment to contribute more effectively to downsizing, compared to a configuration in which the respective planes formed by the coupling magnetic path, the first magnetic path, and the second magnetic path are the same.

In addition, each of the first core portion 31 and the second core portion 32 is provided on either side (e.g., on the right in FIG. 3A) along a normal to the coupling plane (i.e., in the third direction D3) with respect to the coupling core portion 30. This allows the reactor 1 according to this embodiment to reduce the length of the coupling magnetic path of the coupling core portion 30, and therefore, contributes more effectively to downsizing, compared to a configuration in which a non-coupling magnetic path is provided between the two windings.

Also, the core member 3 (including the coupling core portion 30, the first core portion 31, and the second core portion 32) is made of a material having a saturation flux density falling within the range from 0.6 T (tesla) to 2.2 T (tesla) (e.g., a dust core in this embodiment). Generally speaking, the dust core has a higher saturation flux density than ferrite. That is to say, the core member 3 according to this embodiment has a higher saturation flux density than a core member made of ferrite. This allows the reactor 1 according to this embodiment to contribute more effectively to downsizing by reducing the volume of the core member 3 and set the coupling coefficient more easily within the range from 0.3 to 0.7, compared to when the core member is made of ferrite. In addition, this eliminates the need to provide a magnetic gap for the core member 3. That is to say, the core member 3 has a gapless structure with no magnetic gaps. In other words, none of the coupling magnetic path, the first magnetic path, or the second magnetic path has a magnetic gap. As used herein, the "magnetic gap" refers to a discontinuous portion (such as an air gap) of the core member 3 on the magnetic path and does not include a bonding portion (such as an adhesive) between multiple constituent elements of the core member 3. This allows the reactor 1 according to this embodiment to reduce a leaking magnetic flux. This reduces the eddy current loss caused by a leaking magnetic flux to the first winding 21 and the second winding 22. In addition, this also reduces the eddy current loss caused to a metallic member (such as a radiator plate for cooling or a chassis) provided around a position where the reactor 1 is disposed. That is to say, the reactor 1 according to this embodiment is able to reduce the unwanted effect on a metallic member provided around the reactor 1.

(3) Variations

Next, variations of the first embodiment will be described. In the following description, any constituent element of these variations, having the same function as a counterpart of the first embodiment described above, will be designated by the same reference numeral as that counterpart's, and description thereof will be omitted herein as appropriate.

(3.1) First Variation

Figure 4:
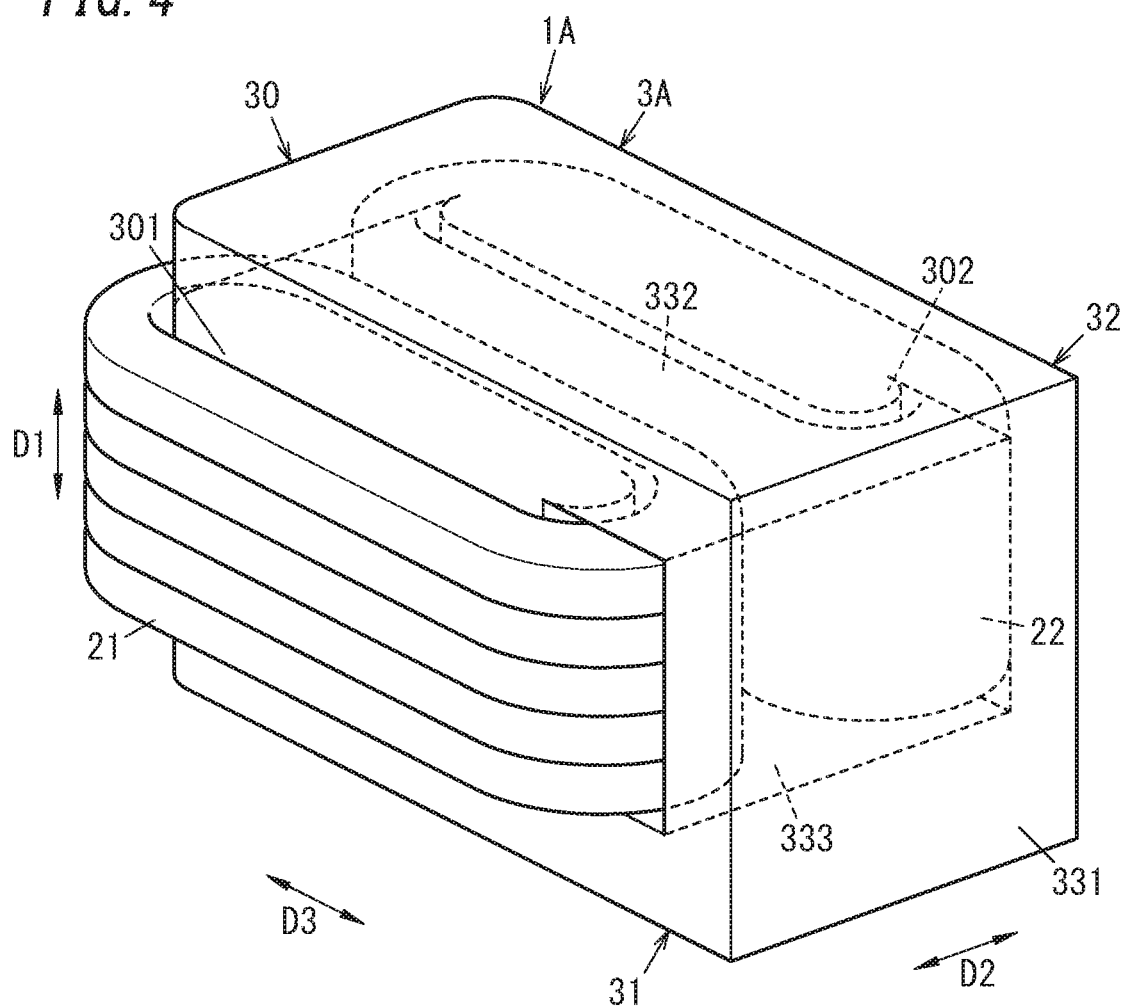
FIG. 4 is a perspective view illustrating the appearance of a reactor according to a first variation of the exemplary embodiment of the present disclosure.
Figure 5:
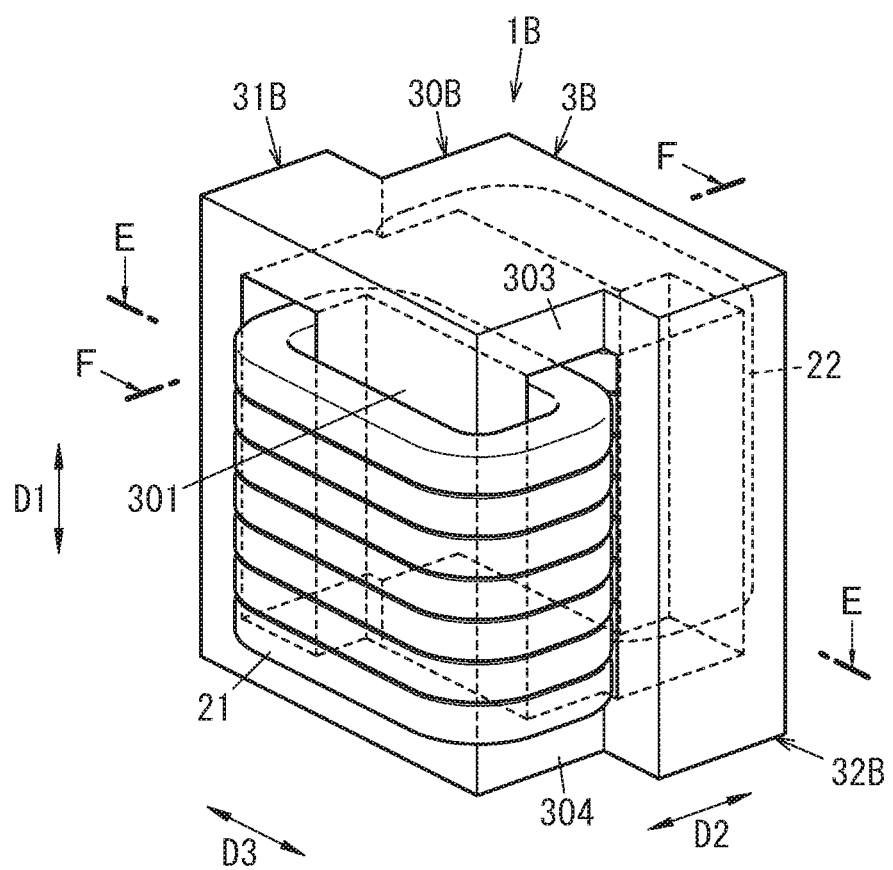
FIG. 5 is a perspective view illustrating the appearance of a reactor according to a second variation of the exemplary embodiment of the present disclosure.

A reactor 1A according to a first variation is shown in FIG. 4.

In the reactor 1A according to this variation, the first core portion 31 and the second core portion 32 are formed to be continuous with each other, which is a major difference from the reactor 1 according to the first embodiment described above (see FIG. 1).

A core member 3A according to this variation includes the first axial portion 301, the second axial portion 302, and connecting portions 331-333. The connecting portion 331 is formed in the shape of a rectangular plate. The connecting portion 331 is configured such that respective portions thereof corresponding to the core piece 311 of the first core portion 31 and the core piece 321 of the second core portion 32 of the core member 3 (see FIG. 1) of the reactor 1 according to the first embodiment are integrated together and continuous with each other. The connecting portion 332 is formed in the shape of a rectangular plate. The connecting portion 332 is configured such that respective portions thereof corresponding to the first connecting portion 303 of the coupling core portion 30, the core piece 312 of the first core portion 31, and the core piece 322 of the second core portion 32 in the core member 3 (see FIG. 1) of the reactor 1 according to the first embodiment are integrated together and continuous with each other. The connecting portion 333 is formed in the shape of a rectangular plate. The connecting portion 333 is configured such that respective portions thereof corresponding to the second connecting portion 304 of the coupling core portion 30, the core piece 313 of the first core portion 31, and the core piece 323 of the second core portion 32 in the core member 3 (see FIG. 1) of the reactor 1 according to the first embodiment are integrated together and continuous with each other.

In the reactor 1A according to this variation, part of the connecting portions 331-333 surrounding the first winding 21 along with the first axial portion 301 is the first core portion 31 that forms the first magnetic path, and the magnetic flux generated by the first winding 21 is dominating. Also, another part of the connecting portions 331-333 surrounding the second winding 22 along with the second axial portion 302 is the second core portion 32 that forms the second magnetic path, and the magnetic flux generated by the second winding 22 is dominating.

In the reactor 1A according to this variation, the first core portion 31 and the second core portion 32 are formed to be continuous with each other, thus allowing the core member 3A to have increased mechanical strength.

In the example illustrated in FIG. 4, the first core portion 31 and the second core portion 32 are formed to be continuous with each other in their entirety. However, this is only an example and should not be construed as limiting. Alternatively, the first core portion 31 and the second core portion 32 may also be formed to be continuous with each other only partially. For example, a through hole may be cut through the connecting portion 331 to run in the third direction D3 such that respective portions corresponding to the core piece 311 of the first core portion 31 and the core piece 321 of the second core portion 32 in the core member 3 (see FIG. 1) of the reactor 1 according to the first embodiment are spaced apart from each other in the second direction D2.

(3.2) Second Variation

Next, a reactor 1B according to a second variation is shown in FIG. 5 and FIGS. 6A-6D.

In the reactor 1B according to this variation, a first core portion 31B and a second core portion 32B are provided in mutually opposite sides with respect to a coupling core portion 30B, which is a major difference from the reactors 1, 1A described above (see FIGS. 1 and 4).

Figure 6B:
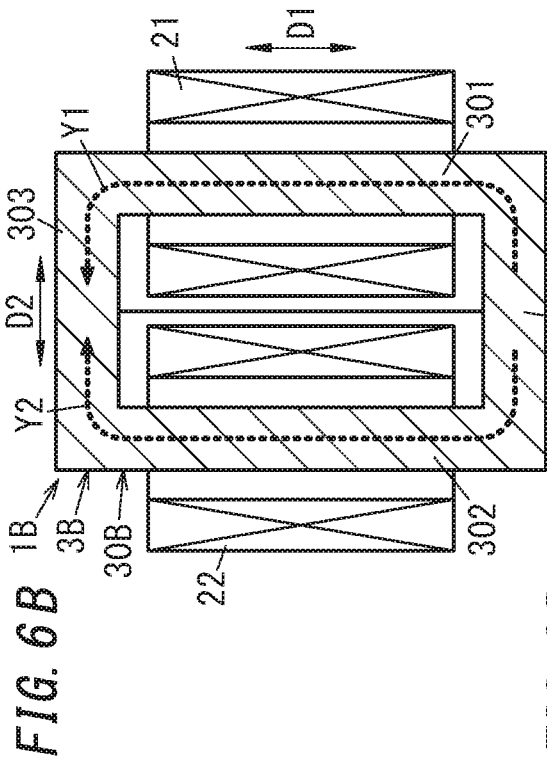
FIG. 6B is a cross-sectional view of the reactor taken along the plane F-F.
Figure 6D:
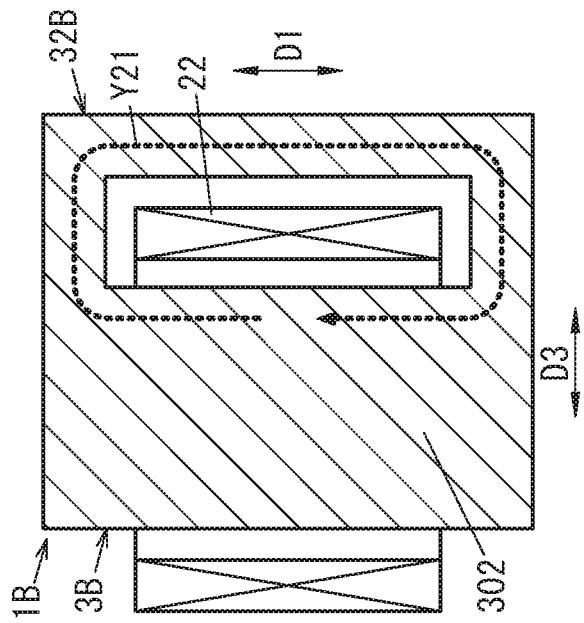
FIG. 6C is a cross-sectional view of the reactor taken along the plane G-G and FIG. 6D is a cross-sectional view of the reactor taken along the plane H-H.

Specifically, in the reactor 1B according to this variation, the first core portion 31B is provided on one side (e.g., on the left in FIG. 6C) along a normal to the coupling plane (i.e., in the third direction D3) aligned with the first direction D1 and the second direction D2 of the coupling core portion 30B (see FIG. 6B) and the second core portion 32B is provided on the other side (e.g., on the right in FIG. 6D) in the third direction D3. In FIG. 6B, the direction of the DC magnetic flux generated by the first winding 21 on the coupling magnetic path is indicated schematically by the dotted arrow Y1, and the direction of the DC magnetic flux generated by the second winding 22 is indicated schematically by the dotted arrow Y2. Also, in FIG. 6C, the direction of the DC magnetic flux generated by the first winding 21 on the first magnetic path is indicated schematically by the dotted arrow Y11. Furthermore, in FIG. 6D, the direction of the DC magnetic flux generated by the second winding 22 on the second magnetic path is indicated schematically by the dotted arrow Y21.

Figure 6A:
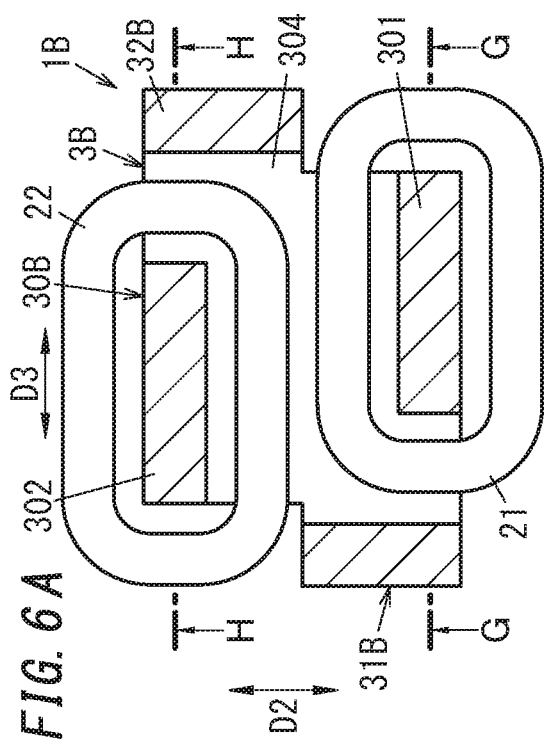
FIG. 6A is a cross-sectional view of the reactor taken along the plane E-E.
Figure 6C:
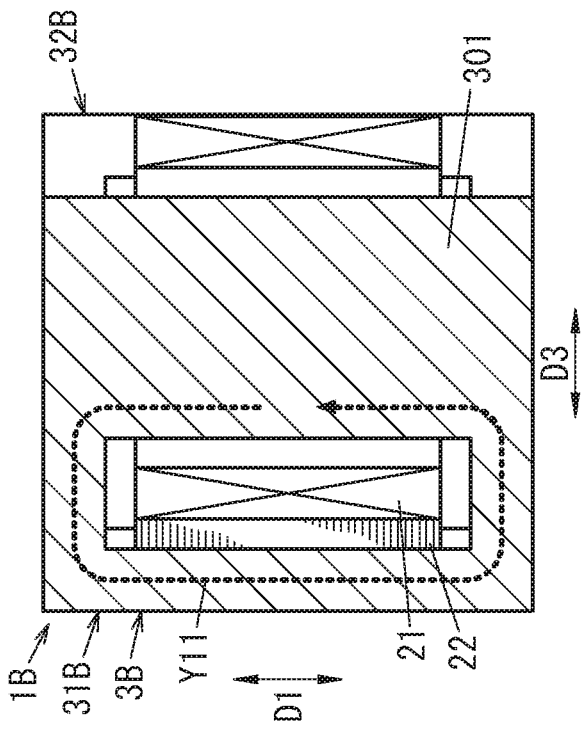

Furthermore, in the core member 3B according to this variation, the first axial portion 301 and the second axial portion 302 are formed to shift from each other in the third direction D3 such that the first axial portion 301 and the second axial portion 302 partially overlap with each other in the second direction D2 (see FIG. 6A). Specifically, in the third direction D3, the first axial portion 301 is arranged closer to the second core portion 32B than the second axial portion 302 is, and the second axial portion 302 is arranged closer to the first core portion 31B than the first axial portion 301 is. Shifting the first axial portion 301 and the second axial portion 302 in the third direction D3 causes the first winding 21 and second winding 22 to shift from each other as well. Thus, in the second direction D2, the first core portion 31 and the second winding 22 partially overlap with each other, and the second core portion 32 and the first winding 21 partially overlap with each other, thus allowing the reactor 1B to have a reduced size. Note that the core member 3B needs to be configured such that along a normal to the first plane and the second plane (i.e., in the second direction D2), the first axial portion 301 and the second axial portion 302 at least partially overlap with each other. This allows a coupling magnetic path to be formed in the coupling core portion 30B along a coupling plane that is a plane aligned with the first direction D1 and the second direction D2.

(3.3) Other Variations

Next, other variations will be enumerated one after another. Note that the variations to be described below may be adopted as appropriate in combination with the exemplary embodiment and variations described above.

In the reactor 1 according to the exemplary embodiment described above, the coupling core portion 30, the first core portion 31, and the second core portion 32 are formed integrally with each other. However, these members may be separate from each other. For example, the first axial portion 301 is configured to serve as both the coupling magnetic path and the first magnetic path in the example described above. Alternatively, the first axial portion 301 may include an axial portion forming the coupling magnetic path and another axial portion forming the first magnetic path, which are provided separately from each other. Likewise, the second axial portion 302 is configured to serve as both the coupling magnetic path and the second magnetic path in the example described above. Alternatively, the second axial portion 302 may include an axial portion forming the coupling magnetic path and another axial portion forming the second magnetic path, which are provided separately from each other. In that case, the two axial portions forming the first axial portion 301 (or the second axial portion 302) may be bonded together with an adhesive, for example. Optionally, the coupling core portion 30, the first core portion 31, and the second core portion 32 may be made of respectively different materials. For example, the reactor 1 may also be configured to control the coupling coefficient by setting, during the design process of the reactor 1, the permeabilities of the constituent material for the coupling core portion 30 and the constituent material for the first core portion 31 and the second core portion 32 at different values.

The reactor 1 according to the exemplary embodiment described above includes the first core portion 31 and the second core portion 32 as a non-coupling magnetic path to implement the inductor capability. Alternatively, the reactor 1 may be configured to include either, not both, of the first core portion 31 and the second core portion 32.

Optionally, the reactor 1 may further include a bobbin. The bobbin may be provided such that either the first winding 21 or the second winding 22 is wound around the bobbin and either the first axial portion 301 or the second axial portion 302 passes through the bobbin.

Furthermore, the reactor 1 may also be configured such that the first winding 21, the second winding 22, and the core member 3 are encapsulated together with an encapsulating member such as a resin. This reduces the chances of the first winding 21 and the second winding 22 being wound in unintentional directions.

(Resume)

A reactor (1, 1A, 1B) according to a first aspect includes a first winding (21), a second winding (22), a coupling core portion (30, 30B), a first core portion (31, 31B), and a second core portion (32, 32B). The coupling core portion (30, 30B) forms a coupling magnetic path, through which a magnetic flux generated by the first winding (21) when the first winding (21) is energized and a magnetic flux generated by the second winding (22) when the second winding (22) is energized pass, which magnetically couples the first winding (21) and the second winding (22) together, and which is aligned with a coupling plane that is a predetermined plane. The first core portion (31, 31B) forms a first magnetic path, through which the magnetic flux generated by the first winding (21) when the first winding (21) is energized passes and which is aligned with a first plane. The second core portion (32, 32B) forms a second magnetic path, through which the magnetic flux generated by the second winding (22) when the second winding (22) is energized passes and which is aligned with a second plane. The coupling plane intersects at right angles with the first plane and the second plane.

This aspect allows the first core portion (31, 31B) and the second core portion (32, 32B) to be provided in a different direction from the direction in which the first winding (21) and the second winding (22) are arranged side by side with respect to the coupling core portion (30, 30B). This contributes to downsizing the reactor (1, 1A, 1B).

In a reactor (1, 1A, 1B) according to a second aspect, which may be implemented in conjunction with the first aspect, a dimension (L10), measured along a normal to the coupling plane (i.e., in a third direction D3), of the coupling core portion (30, 30B) is greater than a dimension (L11), measured along a normal to the first plane (i.e., in a second direction D2), of the first core portion (31, 31B) and a dimension (L12), measured along a normal to the second plane (i.e., in the second direction D2), of the second core portion (32, 32B).

This aspect allows the coupling coefficients of the first winding (21) and the second winding (22) to be controlled by adjusting, during the design process of the reactor (1, 1A, 1B), the dimension (L10), measured along a normal to the coupling plane (i.e., in the third direction D3), of the coupling core portion (30, 30B).

In a reactor (1, 1A, 1B) according to a third aspect, which may be implemented in conjunction with the second aspect, each of the first core portion (31, 31B) and the second core portion (32, 32B) is provided on either side along a normal to the coupling plane (i.e., in the third direction D3) with respect to the coupling core portion (30, 30B).

This aspect not only reduces the chances of the coupling coefficient becoming too low but also contributes to downsizing the reactor (1, 1A, 1B).

In a reactor (1, 1A) according to a fourth aspect, which may be implemented in conjunction with the third aspect, the first core portion (31) and the second core portion (32)

are provided on the same side along the normal to the coupling plane (i.e., in the third direction D3) with respect to the coupling core portion (30).

This aspect contributes to downsizing the reactor (1, 1A, 1B).

In a reactor (1A) according to a fifth aspect, which may be implemented in conjunction with the fourth aspect, the first core portion (31) and the second core portion (32) are continuous with each other.

This aspect allows the first core portion (31) and the second core portion (32) to have increased mechanical strength.

In a reactor (1B) according to a sixth aspect, which may be implemented in conjunction with the third aspect, the first core portion (31, 31B) and the second core portion (32, 32B) are provided on mutually opposite sides along the normal to the coupling plane (i.e., in the third direction D3) with respect to the coupling core portion (30, 30B).

This aspect contributes to downsizing the reactor (1B).

In a reactor (1B) according to a seventh aspect, which may be implemented in conjunction with the sixth aspect, the first winding (21) and the second winding (22) are arranged to partially overlap with each other along the normal to the first plane (i.e., in the second direction D2) and along the normal to the second plane (i.e., in the second direction D2).

This aspect allows the reactor (1B) to be configured such that part of the first winding (21) overlaps with the second core portion (32B), and part of the second winding (22) overlaps with the first core portion (31B), along the normal to the first and second planes (i.e., in the second direction D2). This contributes to downsizing the reactor (1B).

In a reactor (1, 1A, 1B) according to an eighth aspect, which may be implemented in conjunction with any one of the first to fourth aspects, the coupling core portion (30, 30B), the first core portion (31, 31B), and the second core portion (32, 32B) are integrated together.

This aspect allows the coupling core portion (30, 30B), the first core portion (31, 31B), and the second core portion (32, 32B) to be made of the same material.

In a reactor (1, 1A, 1B) according to a ninth aspect, which may be implemented in conjunction with any one of the first to seventh aspects, the coupling core portion (30, 30B) is made of a material having a different permeability from a constituent material for the first core portion (31, 31B) and the second core portion (32, 32B).

This aspect makes the coupling coefficient controllable by adjusting, during the design process of the reactor (1, 1A, 1B), the respective permeabilities of the constituent material for the coupling core portion (30, 30B) and the constituent material for the first core portion (31, 31B) and the second core portion (32, 32B).

In a reactor (1, 1A, 1B) according to a tenth aspect, which may be implemented in conjunction with any one of the first to ninth aspects, the first winding (21) and the second winding (22) have a coupling coefficient falling within a range from 0.3 to 0.7.

This aspect allows a balance to be struck between the size of the reactor (1, 1A. 1B) and that of an inductor.

In a reactor (1, 1A, 1B) according to an eleventh aspect, which may be implemented in conjunction with any one of the first to tenth aspects, the coupling core portion (30, 30B), the first core portion (31, 31B), and the second core portion (32, 32B) each have a saturation flux density falling within a range from 0.6 T to 2.2 T.

This aspect allows a balance to be struck between the size of the reactor (1, 1A, 1B) and that of an inductor.

A core member (3, 3A, 3B) according to a twelfth aspect includes the coupling core portion (30, 30B), the first core portion (31, 31B), and the second core portion (32, 32B) of the reactor (1, 1A, 1B) according to any one of the first to eleventh aspects.

This aspect contributes to downsizing the core member (3, 3A, 3B), and eventually, downsizing the reactor (1, 1A. 1B).

A power supply circuit (100) according to a thirteenth aspect includes: the reactor (1, 1A, 1B) according to any one of the first to eleventh aspects; and a control unit (141) to control an electric current flowing through the first winding (21) and the second winding (22).

This aspect contributes to downsizing the reactor (1, 1A, 1B), and eventually, downsizing the power supply circuit (100).

In a power supply circuit (100) according to a fourteenth aspect, which may be implemented in conjunction with the thirteenth aspect, the control unit (141) makes a phase of a ripple current flowing through the first winding (21) and a phase of a ripple current flowing through the second winding (22) shifted from each other.

This aspect reduces the magnetic saturation of the coupling core portion (30, 30B).

Note that constituent elements according to the second to eleventh aspects are not essential constituent elements for the reactor (1, 1A, 1B) but may be omitted as appropriate.

REFERENCE SIGNS LIST 1, 1A, 1B Reactor
21 First Winding
22 Second Winding
3, 3A, 3B Core Member
30, 30B Coupling Core Portion
31, 31B First Core Portion
32, 32B Second Core Portion
100 Power Supply Circuit
141 Control Unit
L10, L11, L12 Dimension

The invention claimed is:

1. A reactor comprising:
a first winding;
a second winding;
a coupling core portion configured to form a coupling magnetic path, through which a magnetic flux generated by the first winding when the first winding is energized and a magnetic flux generated by the second winding when the second winding is energized pass, which magnetically couples the first winding and the second winding together, and which is aligned with a coupling plane that is a predetermined plane;
a first core portion configured to form a first magnetic path, through which the magnetic flux generated by the first winding when the first winding is energized passes and which is aligned with a first plane; and
a second core portion configured to form a second magnetic path, through which the magnetic flux generated by the second winding when the second winding is energized passes and which is aligned with a second plane,
the coupling plane intersecting at right angles with the first plane and the second plane.

2. The reactor of claim 1, wherein
a dimension, measured along a normal to the coupling plane, of the coupling core portion is greater than a dimension, measured along a normal to the first plane, of the first core portion and a dimension, measured along a normal to the second plane, of the second core portion.

3. The reactor of claim 2, wherein
each of the first core portion and the second core portion is provided on either side along a normal to the coupling plane with respect to the coupling core portion.

4. The reactor of claim 3, wherein
the first core portion and the second core portion are provided on the same side along the normal to the coupling plane with respect to the coupling core portion.

5. The reactor of claim 4, wherein
the first core portion and the second core portion are continuous with each other.

6. The reactor of claim 3, wherein
the first core portion and the second core portion are provided on mutually opposite sides along the normal to the coupling plane with respect to the coupling core portion.

7. The reactor of claim 6, wherein
the first winding and the second winding are arranged to partially overlap with each other along the normal to the first plane and along the normal to the second plane.

8. The reactor of claim 1, wherein
the coupling core portion, the first core portion, and the second core portion are integrated together.

9. The reactor of claim 1, wherein
the coupling core portion is made of a material having a different permeability from a constituent material for the first core portion and the second core portion.

10. The reactor of claim 1, wherein
the first winding and the second winding have a coupling coefficient falling within a range from 0.3 to 0.7.

11. The reactor of claim 1, wherein
the coupling core portion, the first core portion, and the second core portion each have a saturation flux density falling within a range from 0.6 T to 2.2 T.

12. A core member comprising the coupling core portion, the first core portion, and the second core portion of the reactor of claim 1.

13. A power supply circuit comprising:
the reactor of claim 1; and
a control unit configured to control an electric current flowing through the first winding and the second winding.

14. The power supply circuit of claim 13, wherein
the control unit is configured to make a phase of a ripple current flowing through the first winding and a phase of a ripple current flowing through the second winding shifted from each other.

15. The reactor of claim 2, wherein
the coupling core portion, the first core portion, and the second core portion are integrated together.

16. The reactor of claim 3, wherein
the coupling core portion, the first core portion, and the second core portion are integrated together.

17. The reactor of claim 4, wherein
the coupling core portion, the first core portion, and the second core portion are integrated together.

* * * * *